United States Patent
Choi et al.

(10) Patent No.: US 8,039,761 B2
(45) Date of Patent: Oct. 18, 2011

(54) PRINTED CIRCUIT BOARD WITH SOLDER BUMP ON SOLDER PAD AND FLOW PREVENTING DAM

(75) Inventors: Jin Won Choi, Gyunggi-do (KR); Seung Wan Kim, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 379 days.

(21) Appl. No.: 12/379,759

(22) Filed: Feb. 27, 2009

(65) Prior Publication Data
US 2010/0116534 A1   May 13, 2010

(30) Foreign Application Priority Data
Nov. 12, 2008   (KR) .................. 10-2008-0112362

(51) Int. Cl.
*H05K 1/11*   (2006.01)
(52) U.S. Cl. .................................................... 174/263
(58) Field of Classification Search .......... 174/260–266; 361/767; 257/737, 684
See application file for complete search history.

(56) References Cited

U.S. PATENT DOCUMENTS

| | | | | |
|---|---|---|---|---|
| 5,293,006 A | * | 3/1994 | Yung | 174/261 |
| 6,291,778 B1 | * | 9/2001 | Asai et al. | 174/263 |
| 6,303,880 B1 | * | 10/2001 | Asai et al. | 174/263 |
| 6,630,730 B2 | * | 10/2003 | Grigg | 257/684 |
| 6,853,089 B2 | | 2/2005 | Ujiie et al. | |
| 7,041,532 B2 | * | 5/2006 | Grigg | 438/106 |
| 2009/0120680 A1 | * | 5/2009 | Tanno et al. | 174/263 |
| 2009/0314537 A1 | * | 12/2009 | Hirose et al. | 174/263 |
| 2009/0315179 A1 | * | 12/2009 | Shigihara et al. | 257/737 |

FOREIGN PATENT DOCUMENTS

| | | |
|---|---|---|
| JP | 2000-260818 | 9/2000 |
| JP | 2006-173654 | 6/2006 |
| KR | 100691443 | 2/2007 |

OTHER PUBLICATIONS

Korean Office Action mailed Jul. 28, 2010 and issued in corresponding Korean Patent Application No. 10-2008-0112362 (Reference BA) cited U.S. Published Patent No. 6,853,089 and Korean Patent Registration No. 10-0691443 (References AA and AG).
Korean Office Action mailed Jul. 28, 2010 and issued in corresponding Korean Patent Application No. 10-2008-0112362.

* cited by examiner

*Primary Examiner* — Chandrika Prasad

(57) ABSTRACT

Disclosed is a printed circuit board having a flow preventing dam and a manufacturing method thereof. The printed circuit board includes a base substrate having a solder pad, a solder bump formed on the solder pad of the base substrate, and a flow preventing dam formed on a peripheral area of the base substrate using a dry film resist. The flow preventing dam can prevent the outflow of an underfill solution and can be simply formed.

7 Claims, 6 Drawing Sheets

PRINTED CIRCUIT BOARD WITH SOLDER BUMP ON SOLDER PAD AND FLOW PREVENTING DAM

CROSS REFERENCE TO RELATED APPLICATION

This application claims the benefit of Korean Patent Application No. 10-2008-0112362, filed Nov. 12, 2008, entitled "A printed circuit board having a flow preventing dam and a manufacturing method of the same", which is hereby incorporated by reference in its entirety into this application.

BACKGROUND OF THE INVENTION

1. Field of the Invention

The present invention relates to a printed circuit board (PCB) having a flow preventing dam and a manufacturing method thereof, and more particularly to a PCB having a flow preventing dam, in which the flow preventing dam is provided on the peripheral area of the PCB so as to prevent the outflow of an underfill solution which is introduced between the PCB and a semiconductor chip which is flip chip bonded thereto.

2. Description of the Related Art

With the recent advancement of electronics industries, there is a demand for increasing performance and functionality of electronic components and reducing the size thereof. Accordingly, high integration, slimness and fine circuit patterning are also required on a substrate for surface mounting components, such as SIP (System in Package), 3D package, etc.

In particular, in techniques for mounting electronic components on the surface of a substrate, a wire bonding process or a flip chip bonding process is utilized for electrical connection between an electronic component and a substrate.

The wire bonding process includes bonding an electronic component having design circuits to a PCB using an adhesive, connecting a lead frame of the PCB to a metal terminal (i.e., pad) of the electronic component using a metal wire to transmit and receive information therebetween, and molding the electronic component and the wire with thermosetting resin or thermoplastic resin.

The flip chip bonding process includes forming an external connection terminal (i.e., bump) having a size of tens of μm to hundreds of μm on an electronic component using a material such as gold, solder or another metal, and flipping the electronic component having the bump so that the surface thereof faces the substrate and is thus mounted on the substrate, unlike the mounting operation based on the wire bonding.

Although the wire bonding process has higher productivity compared to other packaging processes, it needs wires for connection to the PCB, and thus the size of a module is increased and an additional procedure is required. Hence, the flip chip bonding process is mainly employed.

FIGS. 1 and 2 are views showing a process of packaging a flip chip semiconductor package according to a conventional technique.

As shown in FIGS. 1 and 2, the flip chip bonding according to the conventional technique is performed in a manner such that solder balls 16 are attached to the connection pads 14 of a PCB 12 and a semiconductor chip 18 is mounted on the PCB 12 by means of the solder balls 16.

In this way, however, when the semiconductor chip 18 is mounted on the PCB 12, a gap G is formed between the semiconductor chip 18 and the PCB 12 due to the height of the solder balls 16 attached to the connection pads 14 of the PCB 12, undesirably weakening the ability to support the semiconductor chip 18 and causing cracks around the soldering portion of the solder balls 16. In particular, in the case where a temperature change occurs, the coefficient of thermal expansion between the semiconductor chip 18 and the PCB 12 is different, and thus thermal stress is applied to the solder balls 16, thereby causing cracks on the solder balls 16.

Hence, with the goal of stably supporting the semiconductor chip 18, an underfill solution 22 of a liquid material is introduced into the gap G between the semiconductor chip 18 and the PCB 12 using a dispenser 20.

The underfill solution 22 is introduced in a small amount between the semiconductor chip 18 and the PCB 12 and thus functions as an adhesive for holding the chip and plays a role in protecting the chip from the external environment, unlike a conventional semiconductor molding material (EMC) for packaging the entire semiconductor chip 18.

However, in the course of introducing the underfill solution 22 using the dispenser 20, part of the underfill solution 22 which is introduced into the gap G between the semiconductor chip 18 and the PCB 12 may undesirably overflow the outer edge of the PCB 12 from the position where the dispenser 20 is located, causing defects.

In order to solve this problem, there have been proposed methods of forming a dam on the peripheral area of the PCB using a dispensing process.

However, the dispensing process which is used to form a linear dam through linear extrusion of epoxy resin from a dispensing nozzle is problematic in that the width of the dam may be non-uniform, and the shape of the dam may become winding due to frictional force at the end of the dispensing nozzle.

Further, an additional dispensing apparatus is required to form the dam, and a process for forming the dam should be additionally carried out.

SUMMARY OF THE INVENTION

Accordingly, the present invention has been made keeping in mind the problems encountered in the related art and the present invention provides a PCB having a flow preventing dam, which is able to prevent the outflow of an underfill solution, and a manufacturing method thereof.

In addition, the present invention provides a PCB having a flow preventing dam, in which the flow preventing dam is formed using a dry film resist for forming a solder bump without a need for an additional dispensing apparatus or dispensing process, and a manufacturing method thereof.

According to a preferred embodiment of the present invention, a PCB having a flow preventing dam includes a base substrate having a solder pad, a solder bump formed on the solder pad of the base substrate, and a flow preventing dam formed on the peripheral area of the base substrate using a dry film resist.

As such, a solder resist layer having an opening for exposing the solder pad may be formed on the base substrate.

The flow preventing dam may include the dry film resist which is attached in a state of being overcured through excessive exposure to the solder resist layer.

Also, a semiconductor chip which is flip chip bonded to the base substrate by means of the solder bump formed on the solder pad of the base substrate may be further included.

The flow preventing dam may be provided to protrude from the base substrate along the outer edge of the semiconductor chip, in order to prevent the outflow of an underfill solution which is introduced into a gap between the semiconductor chip and the base substrate.

The flow preventing dam may be formed to be lower than the upper surface of the semiconductor chip which is flip chip bonded to the base substrate and to be higher than the gap between the semiconductor chip and the base substrate.

The flow preventing dam may be provided between the outer edge of the base substrate and the outer edge of the semiconductor chip.

In addition, according to another preferred embodiment of the present invention, a method of manufacturing a PCB having a flow preventing dam includes (A) applying a dry film resist on a base substrate having a solder pad, and then primarily exposing the dry film resist to light, (B) secondarily exposing the primarily exposed dry film resist formed on a peripheral area of the base substrate to light, thus forming a flow preventing dam, (C) removing the unexposed dry film resist to expose the solder pad, thus forming an opening, (D) printing the opening with a solder paste and then forming a solder bump through a reflow process, and (E) removing the primarily exposed dry film resist.

After (E) removing the primarily exposed dry film resist, (F) flip chip bonding a semiconductor chip to the base substrate by means of the solder bump formed on the solder pad of the base substrate may be farther included.

After (F) flip chip bonding the semiconductor chip, (G) introducing an underfill solution into a gap between the semiconductor chip and the base substrate may be further included.

The flow preventing dam may be provided to protrude from the base substrate along the outer edge of the semiconductor chip, in order to prevent outflow of an underfill solution which is introduced into the gap between the semiconductor chip and the base substrate.

The flow preventing dam may be formed to be lower than an upper surface of the semiconductor chip which is flip chip bonded to the base substrate and to be higher than the gap between the semiconductor chip and the base substrate.

The flow preventing dam may be provided between the outer edge of the base substrate and the outer edge of the semiconductor chip.

Also, a solder resist layer having an opening for exposing the solder pad may be formed on the base substrate.

The features and advantages of the present invention will be more clearly understood from the following detailed description taken in conjunction with the accompanying drawings.

Further, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

DESCRIPTION OF THE PREFERRED EMBODIMENTS

Figure 1:
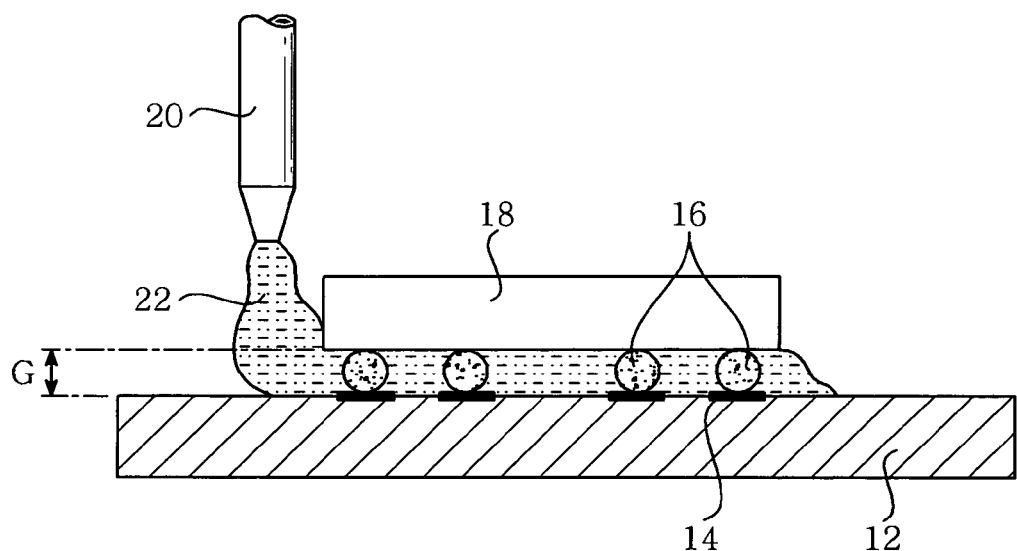
FIGS. 1 and 2 are views showing a process of packaging a flip chip semiconductor package according to a conventional technique.
Figure 2:
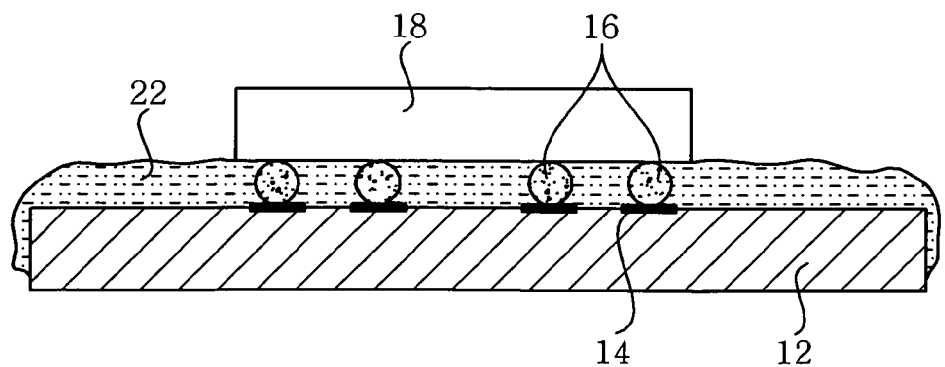

The features and advantages of the present invention will be more clearly understood from the following detailed description and preferred embodiments taken in conjunction with the accompanying drawings. In the description, the terms "first", "second" and so on do not indicate any particular amount, sequence or importance but are used only to distinguish one element from another element. Throughout the drawings, the same reference numerals refer to the same or similar elements, and redundant descriptions are omitted. In order to make the characteristics of the invention clear and for the convenience of description, a detailed description pertaining to the other known techniques may be omitted.

Hereinafter, a detailed description will be given of the preferred embodiment of the present invention, with reference to the accompanying drawings.

PCB having Flow Preventing Dam

Figure 3:
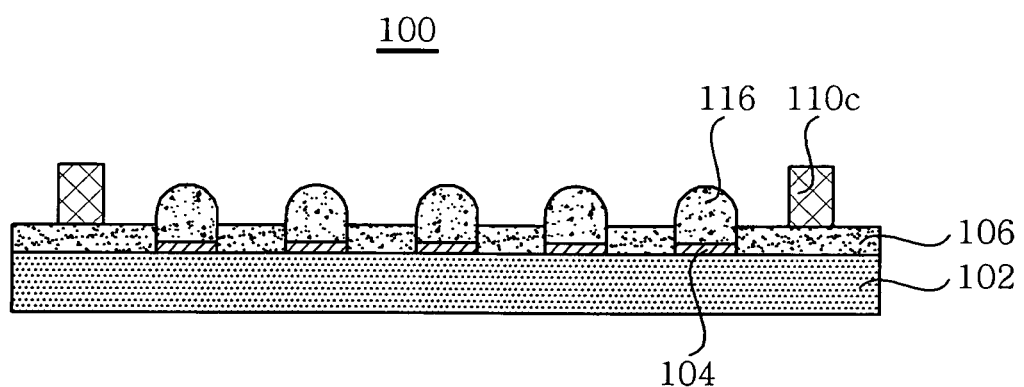
FIG. 3 is a cross-sectional view showing a PCB having a flow preventing dam according to a preferred embodiment of the present invention.

FIG. 3 is a cross-sectional view showing the PCB having a flow preventing dam according to the preferred embodiment of the present invention. With reference to this drawing, the PCB 100 having a flow preventing dam according to the preferred embodiment of the present invention is described below.

As seen in FIG. 3, the PCB 100 having a flow preventing dam according to the present invention includes a base substrate 102 having solder pads 104, solder bumps 116 formed on the solder pads 104, and a flow preventing dam 110c formed on a peripheral area thereof.

The base substrate 102 is configured such that the solder pads 104 are formed on either or both surfaces thereof and a solder resist layer 106 having openings for exposing the solder pads 104 is formed.

The flow preventing dam 110c is composed of a dry film resist which is attached in a state of being overcured through excessive exposure to the solder resist layer 106.

Figure 4:
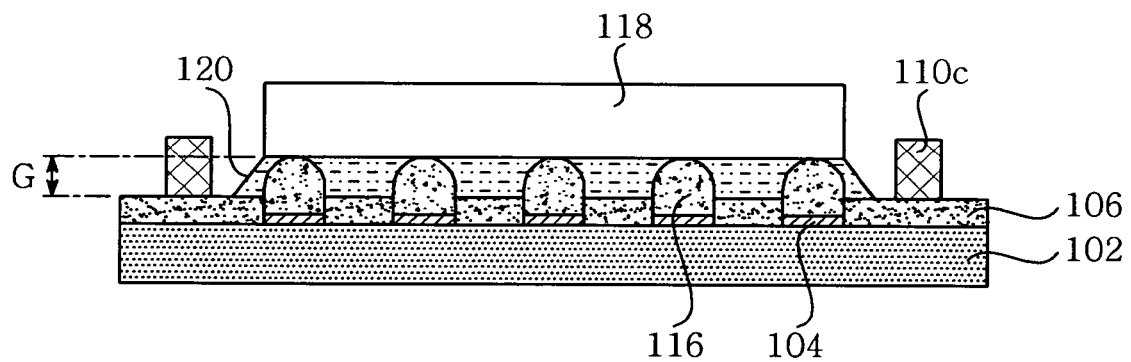
FIG. 4 is a cross-sectional view showing the PCB having a flow preventing dam according to the preferred embodiment of the present invention, to which a semiconductor chip is flip chip bonded.
Figure 5:
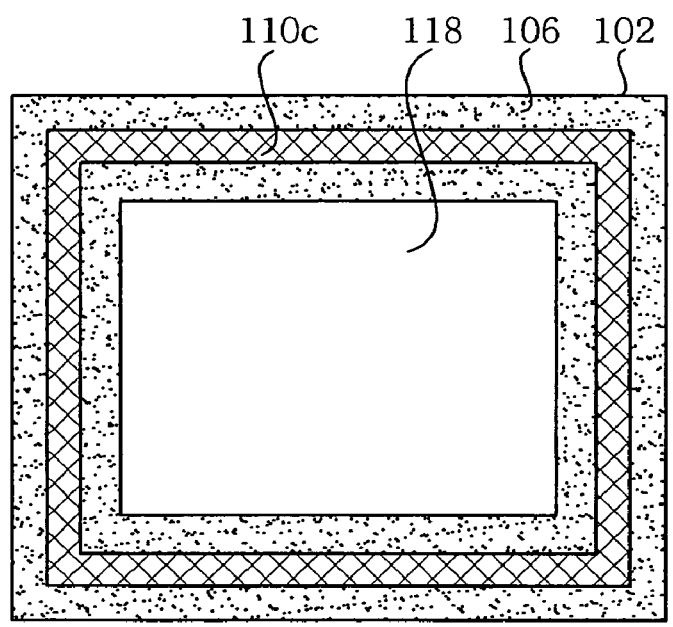
FIG. 5 is a top plan view of FIG. 4.

FIGS. 4 to 5 are a cross-sectional view and a top plan view showing the PCB having a flow preventing dam according to the preferred embodiment of the present invention, to which a semiconductor chip is flip chip bonded;

As shown in FIGS. 4 and 5, the semiconductor chip 118 is flip chip bonded to the base substrate 102 by means of the solder bumps 116 formed on the solder pads 104 of the base substrate 102, and an underfill solution 120 is introduced between the semiconductor chip 118 and the base substrate 102.

The flow preventing dam 110c is provided to protrude from the base substrate 102 along the outer edge of the semiconductor chip 118, thus preventing the outflow of the underfill solution 120.

The flow preventing dam 110c is provided between the outer edge of the base substrate 102 and the outer edge of the semiconductor chip 118, and is formed to be higher than the gap G between the base substrate 102 and the semiconductor chip 118 and to be lower than the upper surface of the semiconductor chip 118, in order to prevent the outflow of the underfill solution 120.

Method of Manufacturing PCB having Flow Preventing Dam

FIGS. 6 to 13 are cross-sectional views showing the process of manufacturing the PCB having a flow preventing dam according to the preferred embodiment of the present invention.

With reference to FIGS. 6 to 13, the method of manufacturing the PCB having a flow preventing dam according to the present invention is described below.

Figure 6:
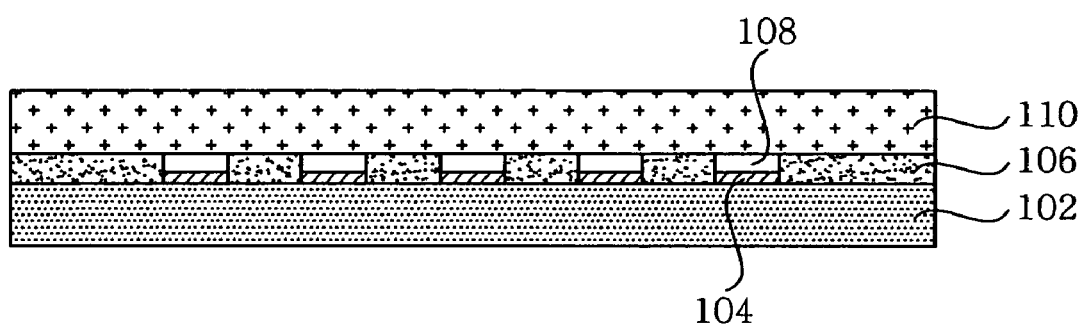
FIGS. 6 to 13 are cross-sectional views showing the process of manufacturing the PCB having a flow preventing dam according to the preferred embodiment of the present invention.

As shown in FIG. 6, a dry film resist 110 is applied on the baser substrate 102 having solder pads 104.

The base substrate 102 is configured such that the solder pads 104 are formed on one surface thereof and the solder resist layer 106 having openings 108 for exposing the solder pads 104 is formed on the base substrate 102.

The dry film resist 110 includes a photoresist in a film form, a mylar film formed on one surface of the photoresist to impart flexibility thereto, and a cover film formed on the other surface thereof.

The dry film resist 110 is applied in a state of peeling off the cover film using a typical dry film laminating apparatus.

The dry film resist 110 may be formed to a predetermined thickness in consideration of the size of the solder bumps 116 and the height of the flow preventing dam 110c.

Figure 7:
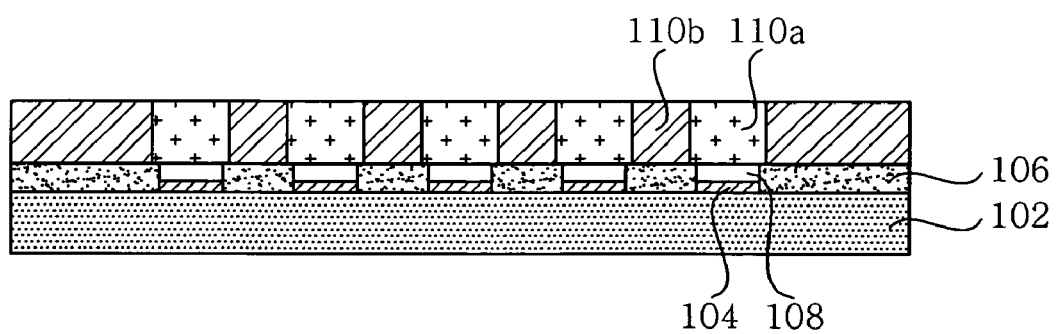

Next, as shown in FIG. 7, the portion of the dry film resist 110, other than the portion of the dry film resist 110 applied on the solder pads 104, is subjected to a primary exposure process.

The primary exposure process is performed by exposing the portion of the dry film resist 110, other than the portion thereof applied on the solder pads 104, to UV light, using a mask (not shown) having a predetermined pattern.

The primarily exposed dry film resist 110b, other than the unexposed dry film resist 110a applied on the solder pads 104, is cured through polymerization in the primary exposure process.

Figure 8:
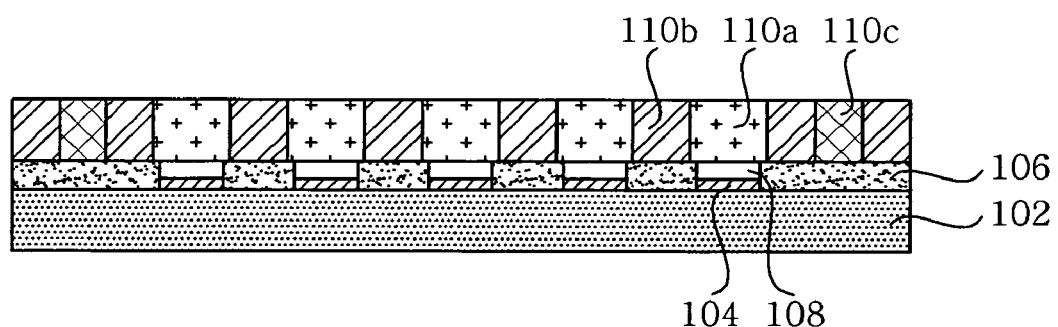

Next, as shown in FIG. 8, the primarily exposed dry film resist 110a formed on the peripheral area of the base substrate 102 is subjected to a secondary exposure process, thus forming the flow preventing dam 110c.

As such, the secondarily exposed dry film resist, which forms the flow preventing dam 110c, is overcured through excessive exposure and is thus more firmly attached to the solder resist layer 106. Accordingly, the dam is not removed in a subsequent dry film resist stripping process.

Figure 9:
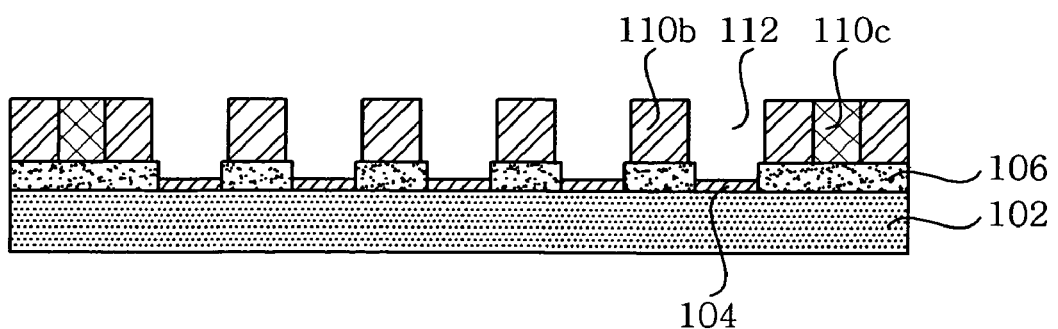

Next, as shown in FIG. 9, the unexposed dry film resist 110a is removed through a development process to expose the solder pads 104, thus forming openings 112.

The development process is performed by dissolving and removing the uncured portion other than the cured portion due to UV exposure, and thus the unexposed dry film resist 110a is removed using a developer such as sodium carbonate ($Na_2CO_3$) or potassium carbonate ($K_2CO_3$).

Figure 10:
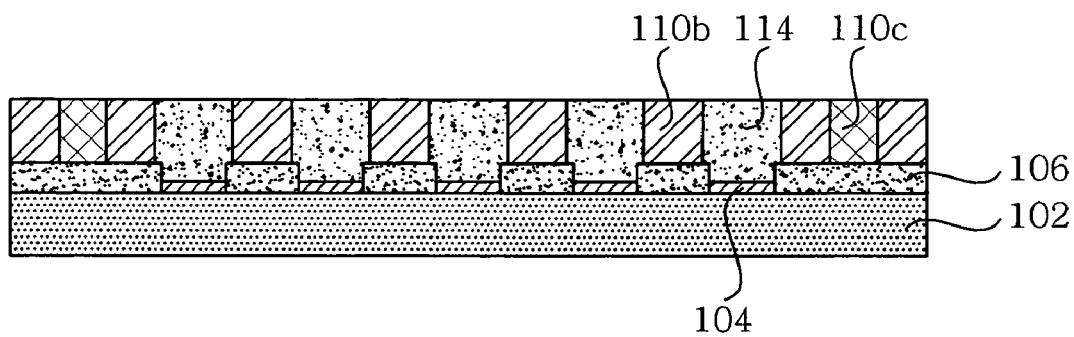

Next, as shown in FIG. 10, the openings 112 are printed with a solder paste.

The solder paste 114 is printed through a screen printing in a manner such that the base substrate 102 is disposed on a printing table, a mask having a plurality of openings is placed on the base substrate, and the solder paste is pressed into the openings of the mask using a squeegee.

Figure 11:
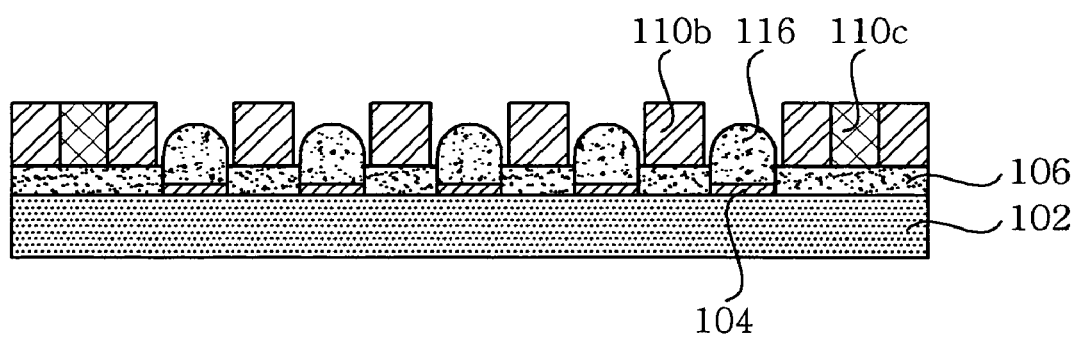

Next, as shown in FIG. 11, the printed solder paste 114 is subjected to a reflow process, thus forming solder bumps 116.

The solder paste 114 printed in the openings 112 of the dry film resist 110 is formed in a round shape through a reflow process to be lower than the flow preventing dam 110c. In the case where the semiconductor chip 118 is mounted on the solder bumps 116, the gap G between the base substrate 102 and the semiconductor chip 118 is lower than the flow preventing dam 110c, and therefore the flow preventing dam 110c can prevent the outflow of the underfill solution which is introduced into the gap G.

Figure 12:
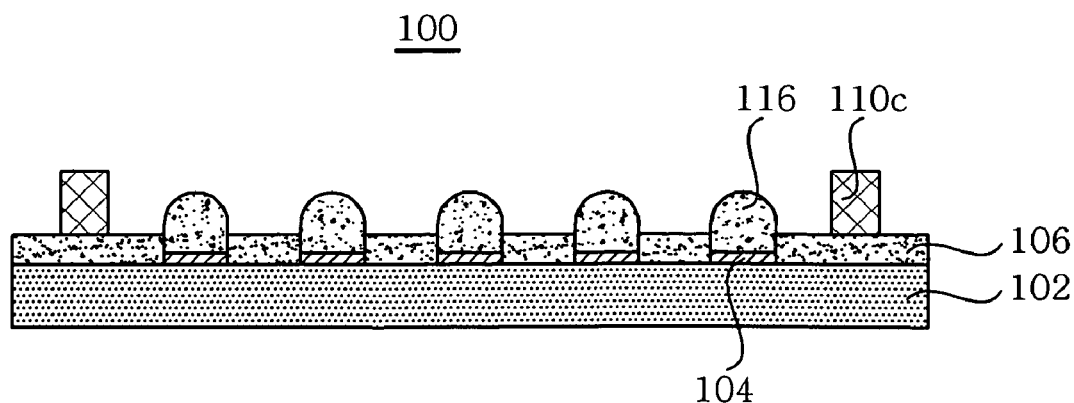

As shown in FIG. 12, the primarily exposed dry film resist 110b is removed.

The primarily exposed dry film resist 110b may be stripped using a stripping solution such as NaOH or KOH.

In the course of bonding the OH— of the stripping solution with the carboxyl group (COOH+) of the dry film resist, the primarily exposed dry film resist 110b gets loose and thus is stripped. Because the secondarily exposed dry film resist, namely, the flow preventing dam 110c, is attached in a state of being overcured through excessive exposure to the solder resist layer 106, it is not removed by the stripping solution.

Figure 13:
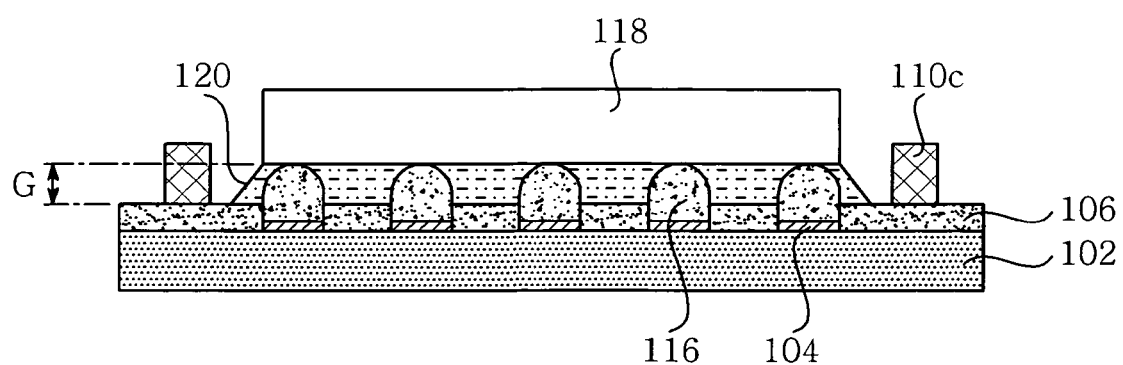

As shown in FIG. 13, the semiconductor chip 118 is flip chip mounted on the base substrate 102 by means of the solder bumps 116, and the underfill solution 120 is introduced into the gap G between the base substrate 102 and the semiconductor chip 118, thus completing a flip chip package.

The flow preventing dam 110c is provided to protrude from the base substrate along the outer edge of the semiconductor chip 118, and is formed to be higher than the gap between the base substrate 102 and the semiconductor chip 118 and to be lower than the upper surface of the semiconductor chip 118, thereby preventing the outflow of the underfill solution.

As described hereinbefore, the present invention provides a PCB having a flow preventing dam and a manufacturing method thereof. According to the present invention, the flow preventing dam is provided, thus preventing the expansion and outflow of an underfill solution.

Also, according to the present invention, the flow preventing dam is formed through excessive exposure of a dry film resist used in the course of forming solder bumps, thus obviating a need for additional material, apparatus, and process.

Also, according to the present invention, the flow preventing dam can be formed with the dry film resist, and thus the height and width thereof are uniform.

Also, according to the present invention, the outflow of the underfill solution is prevented, thus improving the overall package reliability.

Although the preferred embodiment of the present invention regarding the PCB having a flow preventing dam and the manufacturing method thereof has been disclosed for illustrative purposes, those skilled in the art will appreciate that various modifications, additions and substitutions are possible within the scope of the invention.

What is claimed is:

1. A printed circuit board having a flow preventing dam, comprising:
    a base substrate having a solder pad;
    a solder bump formed on the solder pad of the base substrate; and
    a flow preventing dam formed on a peripheral area of the base substrate using a dry film resist.

2. The printed circuit board as set forth in claim 1, wherein a solder resist layer having an opening for exposing the solder pad is formed on the base substrate.

3. The printed circuit board as set forth in claim 1, wherein the flow preventing dam comprises the dry film resist which is attached in a state of being overcured through excessive exposure to the solder resist layer.

4. The printed circuit board as set forth in claim 1, further comprising a semiconductor chip which is flip chip bonded to the base substrate by means of the solder bump formed on the solder pad of the base substrate.

5. The printed circuit board as set forth in claim 4, wherein the flow preventing dam is provided to protrude from the base substrate along an outer edge of the semiconductor chip, in order to prevent outflow of an underfill solution which is introduced into a gap between the semiconductor chip and the base substrate.

6. The printed circuit board as set forth in claim 4, wherein the flow preventing dam is formed to be lower than an upper surface of the semiconductor chip which is flip chip bonded to the base substrate and to be higher than the gap between the semiconductor chip and the base substrate.

7. The printed circuit board as set forth in claim 4, wherein the flow preventing dam is provided between the outer edge of the base substrate and the outer edge of the semiconductor chip.

\* \* \* \* \*